United States Patent [19]

Huet et al.

[11] Patent Number: 4,699,083
[45] Date of Patent: Oct. 13, 1987

[54] MOLECULAR BEAM GENERATOR USING THERMAL DECOMPOSITION FOR MANUFACTURING SEMICONDUCTORS BY EPITAXY

[75] Inventors: Daniel Huet, Boissise Le Roi; Marc Lambert, Orsay, both of France

[73] Assignee: Compagnie Generale d'Electricite, Paris, France

[21] Appl. No.: 801,998

[22] Filed: Nov. 25, 1985

[51] Int. Cl.[4] ............................................. C23C 16/52
[52] U.S. Cl. ................................. 118/719; 118/722; 118/724; 156/DIG. 103
[58] Field of Search ............. 156/DIG. 103; 118/724, 118/722, 719

[56] References Cited

U.S. PATENT DOCUMENTS 4,522,674  6/1985  Ninomiya et al. ............. 118/719 X

FOREIGN PATENT DOCUMENTS 58-215021 12/1983 Japan ........................ 156/DIG. 103
2080271  2/1982 United Kingdom .

OTHER PUBLICATIONS

Journal of Applied Physics, vol. 55, No. 10, May 15, 1984, pp. 3571-3576, American Institute of Physics, N.Y., U.S.; M. B. Panish et al: "Gas Source Molecular Beam Epitaxy of GAxInl-xPyAsl-y", p. 3571, FIG. 1(b), p. 3572.

Primary Examiner—Evan K. Lawrence
Attorney, Agent, or Firm—Sughrue, Mion, Zinn, Macpeak & Seas

[57] ABSTRACT

Arsine or phosphine are thermally decomposed to form a molecular beam of arsenic or phosphorous by using the inside surfaces of a thermal decomposition duct (11) made of quartz or of boron nitride and heated on the outside by radiation from a filament (30). Pierced internal partitions (6a, 6b, 6c, 6d) having successive circumferentially offset holes (6p, 6q, 6r, 6s) increase the decomposition surface area and prevent a molecule from passing through the duct along a straight line.

4 Claims, 9 Drawing Figures

MOLECULAR BEAM GENERATOR USING THERMAL DECOMPOSITION FOR MANUFACTURING SEMICONDUCTORS BY EPITAXY

The present invention relates to a molecular beam generator using thermal decomposition for manufacturing semiconductors by epitaxy. The invention is particularly applicable to manufacturing semiconductor layers of the III-V type such as those which are formed by the following alloys: Ga As; Ga Al As; In Ga As; In Ga As P; and In Ga Al As; which layers are incorporated in monocrystalline heterostructures in order to constitute components for use in optoelectronics. The manufacture of such layers requires the use of molecular beams of type V elements, such as arsenic and phosphorous, which are highly volatile and which must be very pure (7N).

Molecular beam epitaxy consists in condensing the elements of the layer to be formed on a monocrystalline substrate which is raised to a temperature of about 500° C. under an ultra-high vacuum ($10^{-10}$ Torr).

It is necessary to be able to accurately control the flux of the molecular beams of each of the elements in an alloy. Beam fluxes are very different even when only two elements are being alloyed, one from column III and the other from column V of the periodic table, this is because the vapor tensions and the condensation probabilities of the elements are themselves very different. That is why, with reference to elements in column V, rather than forming molecules of phosphorous or of arsenic by subliming a solid charge of such materials in a refractory crucible (e.g. constituted by pyrolytic boron nitride), proposals have been made to provide a molecular beam generator comprising the following components:

a source of primary gas capable of forming various secondary molecules by thermal decomposition, said molecules being suitable for being epitaxially deposited on a crystalline substrate in order to contribute to the formation of a semiconductor layer;

a valve controlling the flux from said source;

a thermal decomposition duct having a refractory wall, an inlet, and an outlet, with said primary gas passing therethrough downstream from said valve in order to thermally decompose said gas by contact with said wall and thus form said secondary molecules at a flux which is controlled by said valve;

a heater filament surrounding said thermal decomposition duct and passing electric current to substantially uniformly heat the walls of said duct by radiation to a temperature suitable for selectively forming those of said secondary molecules which contribute most effectively to the formation of said semiconductor layer;

a heat reflector surrounding said heater filament in such a manner as to increase its efficiency and to make the temperature of the wall of said thermal decomposition duct more uniform; and beam-forming director means disposed downstream from said thermal decomposition duct in order to form a molecular beam of said secondary molecules which is directed towards such a substrate in an enclosure which has been evacuated of gas.

This generator is described in the article "Gas source molecular beam epitaxy of $Ga_xIn_{1-x}P_yAs_{1-y}$" by M. B. PANISH et al at pages 3571-3576 of the Journal of Applied Physics, Volume 55, No. 10, 15, May 1984, published by the American Institute of Physics, New York, USA.

In this known generator the primary gas flows along a tubular thermal decomposition duct, and a drawback appears in that the resulting molecular beam contains more or less incorrect proportions of molecules containing various possible numbers of atoms, such as $P_2$, $P_4$, etc..., and this occurs regardless of the selected heater power.

The aim of the present invention is to obtain, by simple means, a molecular beam, in particular of arsenic or of phosphorous, having a predetermined composition.

The present invention provides a molecular beam generator using thermal decomposition for manufacturing semiconductors by epitaxy. Said generator comprises:

a source (22) of primary gas capable of forming various secondary molecules by thermal decomposition, said molecules being suitable for being epitaxially deposited on a crystalline substrate in order to contribute to the formation of a semiconductor layer;

a valve (20) controlling the flux from said source;

a thermal decomposition duct (11) having a refractory wall, an inlet (11b), and an outlet (11a), with said primary gas passing therethrough downstream from said valve in order to thermally decompose said gas by contact with said wall and thus form said secondary molecules at a flux which is controlled by said valve;

a heater filament (30) surrounding said thermal decomposition duct and passing electric current to substantially uniformly heat the walls of said duct to a temperature suitable for selectively forming those of said secondary molecules which contribute most effectively to the formation of said semiconductor layer; and beam-forming director means (6s, 11a) disposed downstream from said thermal decomposition duct in order to form a molecular beam of said secondary molecules which is directed towards such a substrate in an enclosure evacuated of gas. (The reference numbers refer to the accompanying figures.)

This generator is characterized by the fact that said thermal decomposition duct (11) is in the form of a substantially cylindrical or prismatic elongate body provided with a longitudinal succession of interior transversal partitions (6a, 6b, 6c, 6d) in the shape of discs which form a succession of chambers communicating via a succession of communication orifices (6p, 6q, 6r, 6s), the cross-sectional areas of said orifices being less than one-fourth of the inside cross-sectional area of said body, thereby increasing the number of shocks between the molecules of the primary gas and the walls of said duct.

In accordance with the present invention, it also appears advantageous, at least in some cases, to use the following more particular dispositions:

said successive communication orifices (6p, 6q, 6r, 6s) are placed in the vicinity of different generator lines of the body (11) of the thermal decomposition ducts in order to prevent a molecule of primary gas from passing through said duct along a straight line;

said jet-forming director means comprise a plurality of said orifices (6s) distributed over the surface of the last of said interior partitions (6d) and a terminal length (11a) of the body of said thermal decomposition duct (11) downstream from said partition, thereby forming a uniform beam of limited angular extent;

said heater filament (30) surrounds said thermal decomposition duct (11) without making contact therewith in order to heat it by radiation, a heat deflector (9) surrounding said heat filament (30) in such a manner as to increase its efficiency and to make the temperature of the walls of said thermal decomposition duct (11) more uniform; and a metal capillary duct (2) is connected downstream from said valve in order to make the flux of said primary gas more uniform, said duct being disposed at a distance from said thermal decomposition duct (11) in order to avoid being heated, and being followed by a connection duct (5) to convey said gas to the thermal decomposition duct.

There follows a more detailed description by way of non-limiting example and with reference to the accompanying diagrammatic figures of how the invention may be implemented. It must be understood that the items described and shown may, without going beyond the scope of the invention, be replaced by other items providing the same technical functions. When the same item is shown in several figures, it is designated in each of them by the same reference sign.

FIGS. 5, 6, 7, and 8 are plan views of four interior partitions of said thermal decomposition duct.

Figure 1:
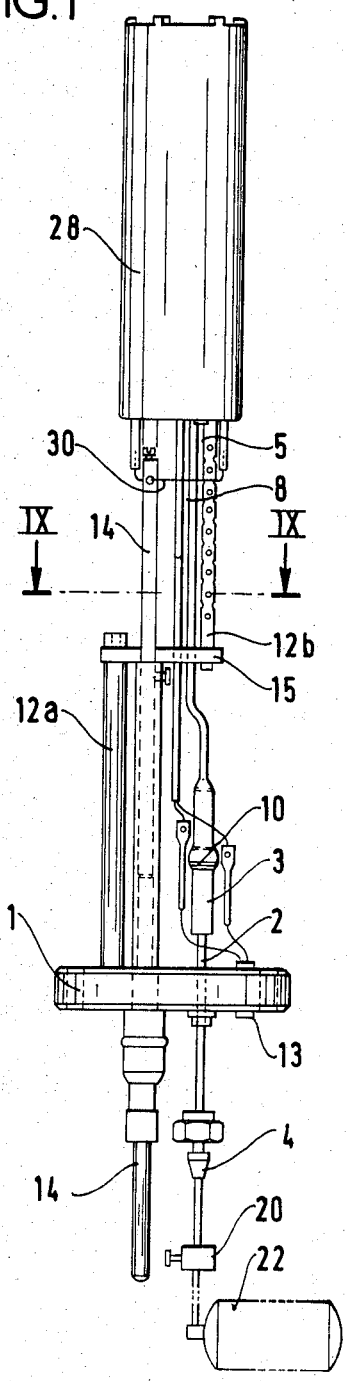
FIG. 1 is a general elevation view of a generator in accordance with the invention.
Figure 2:
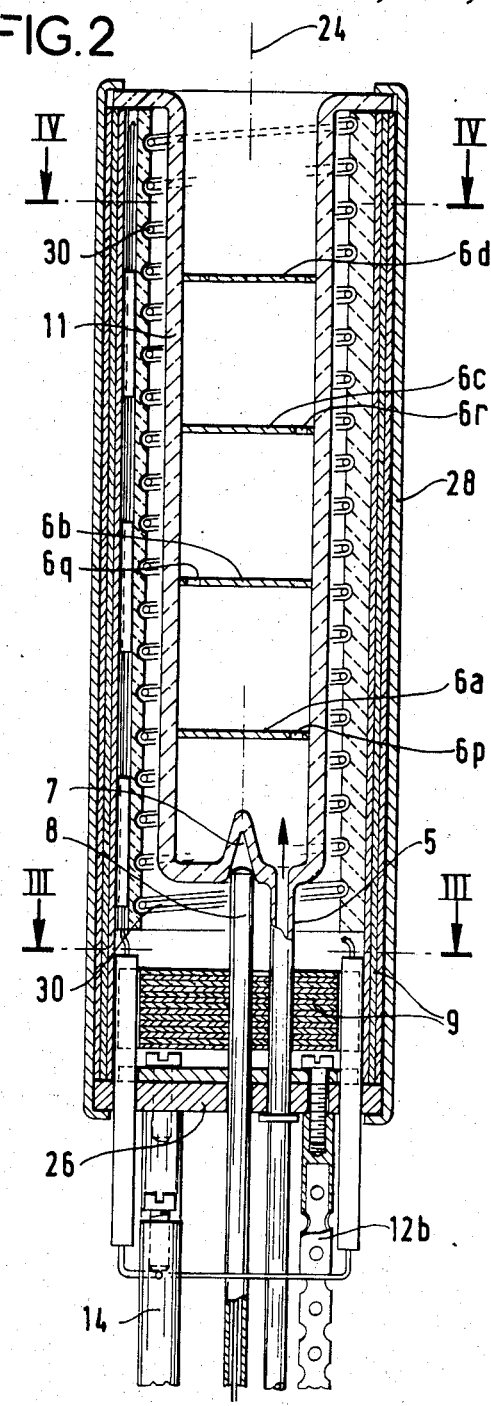
FIG. 2 is a view on a larger scale of the thermal decomposition duct of said generator shown in section on a plane including the vertical axis of said duct.
Figure 3:
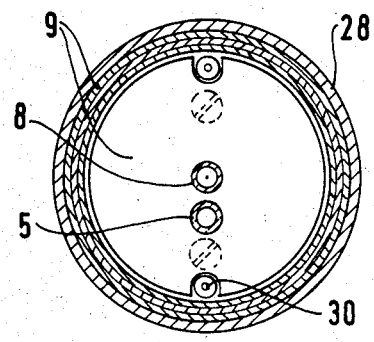
FIG. 3 is a top view of said duct shown in section on a horizontal plane III—III of FIG. 2.
Figure 4:
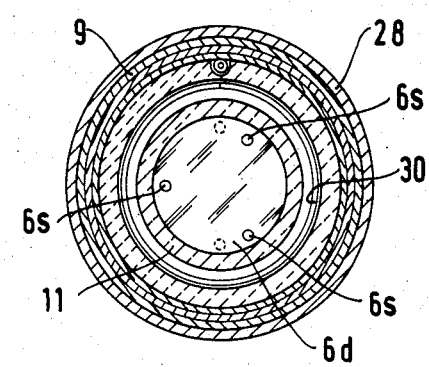
FIG. 4 is a similar view to FIG. 3, on a horizontal section plane IV—IV of FIG. 2.
Figure 5:
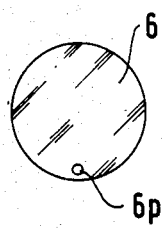
Figure 6:
Figure 7:
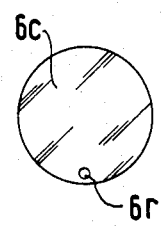
Figure 8:
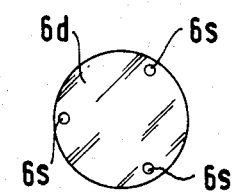
Figure 9:
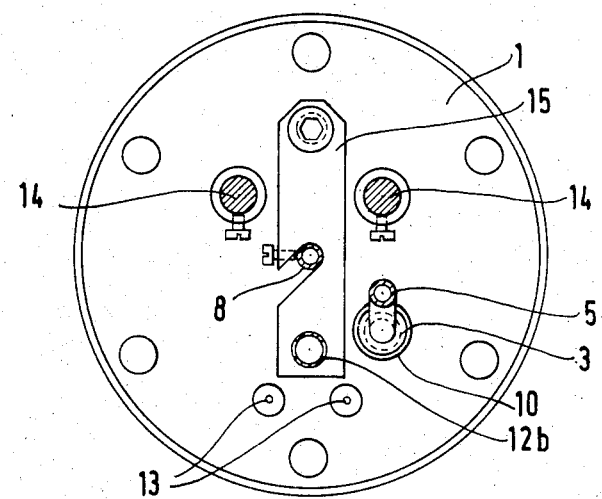

FIG. 9 is a plan view on a larger scale of the support and feed members for said thermal decomposition duct, shown in section on a horizontal plane IX—IX of FIG. 1.

In the example described, the primary gas is constituted by phosphine $PH_3$ and flows upwardly, as does the molecular beam of phosphorous to which it gives rise. The generator comprises the following items:

A stainless steel support disc (1) for sealing to an ultrahigh vacuum enclosure (not shown) in which the gas source is located. Sealing is provided by a silver-plated copper gasket which is compressed between the disk (1) and a clamp fixed to the ultra-high vacuum enclosure.

A capillary tube (2) of NS 225 stainless steel having an outside diameter of 3.2 mm which is welded to the disk 1. The capillary tube serves to inject gas from outside the enclosure towards the thermal decomposition duct, via a servo-valve 20 controlled by a pressure gauge (not shown) disposed inside the ultra-high vacuum enclosure on the path of the molecular beam formed by the generator.

A sleeve (3) of NS 225 stainless steel for connecting the stainless steel capillary tube to a quartz capillary tube (5). The sleeve is connected to the stainless steel capillary tube by argon welding, and sealing is provided with the quartz capillary tube by a glass-metal weld 10.

A stainless steel "Swagclock" connection (4) or equivalent connecting the capillary tube to the servo-valve (20) which controls the gas flux from a pressurized gas tank (22) which constitutes said source of primary gas.

A quartz capillary tube (5) transporting the gas to the thermal decomposition tube (11), while avoiding excessively heating the capillary tube (2).

Quartz baffle-constituting partitions 6a, 6b, 6c, 6d), 0.5 mm thick, situated inside the thermal decomposition duct in order to heat the gas molecules and decompose them. The three partitions (6a, 6b, 6c) each include a peripheral hole (6p, 6q, 6r) offset relative to the holes through the other partitions. This prevents direct outlet of molecules having a rectilinear trajectory. A top partition (6d) has three holes (6s) at 120° intervals so as to provide a molecular beam which is symmetrical about the vertical axis (24) of the thermal decomposition duct (11). The top length (11a) of this duct co-operates with these three holes in order to constitute the above-mentioned jet-forming means. The diameter of each of the partitions is very slightly greater than the diameter of the preceding partition and the duct (11) is slightly flared (at least on its inside surface) thereby enabling the partitions to be fixed in the duct by pushing them in from the length (11a), until they jam against said inside surface.

A pocket (7) situated at the bottom of the quartz duct (11) and receiving a thermocouple (8) for measuring the temperature of the duct.

A tungsten/5% rhenium thermocouple (8) for measuring and regulating the temperature of the thermal decomposition ducts to within 0.1°.

Superposed sheets (9) of tantalum for reflecting the thermal radiation from a tantalum heater filament (30) which is heated by the Joule effect. The radiation is reflected towards the thermal decomposition duct and the sheets constitute said heat reflector. Some of these sheets surround the duct, whereas others are disposed beneath the base thereof.

A glass-metal weld (10).

A quartz thermal decomposition duct (11) receiving the partitions (6) and thus forming four successive decomposition chambers. It nevertheless appears that it would be advantageous to make said duct and said partitions from pyrolytic boron nitride. The duct is 1 mm thick, 89 mm long, and its outside diameter is 20 mm. Its inlet 11b is connected to the capillary tube 5. Its outlet is constituted by its top length 11a.

Support columns (12a, 12b) providing mechanical connection between the support disk and the thermal decomposition duct.

Electrical connections (13) to the thermocouple.

Electrical connections (14) to the heater filament (30).

A thermocouple support plate (15).

The servo-valve (20) for regulating the generator flux.

The tank (22) of phosphine.

The axis (24) of the thermal decomposition duct (11) and of the output molecular beam.

The metal base (26) of a metal tube (28) containing the thermal decomposition duct (11) and the reflector (9).

The tantalum heater filament (30) for raising the thermal decomposition duct to a temperature of at least 800° C., e.g. to 900° C. The filament is situated at 5 mm from the wall of the duct so that heating takes place by radiation, giving rise to a uniform temperature. The electrical power consumed is 80 watts, for example.

We claim:

1. In a molecular beam generator using thermal decomposition for manufacturing semiconductors by epitaxy, said generator comprising:
   a source (22) of primary gas capable of forming various secondary molecules by thermal decomposition, said molecules being suitable for being epitaxially deposited on a crystalline substrate in order to contribute to the formation of a semiconductor layer;

a thermal decomposition duct (11) made of refractory walls with an inlet (11b) for receiving said primary gas, a longitudinal succession of interior transversal partitions (6a, 6b, 6c, 6d) which form a succession of chambers communicating via a succession of communication orifices (6p, 6q, 6r, 6s), for increasing the number of shocks between the molecules of the primary gas and the walls of said duct, and an outlet (11a);

a heater filament (30) surrounding said thermal decomposition duct and passing electric current to substantially uniformly heat the walls of said duct to a temperature suitable for said shocks selectively forming these of said secondary molecules which contribute most effectively to the formation of said semiconductor layer; and beam-forming director means (6s, 11a) disposed downstream from said thermal decomposition duct in order to form a molecular beam of said secondary molecules which is directed towards such a substrate in an enclosure evacuated of gas; the improvement wherein said thermal decomposition duct is in the form of a substantially cylindrical elongate body having plane discs (6a, 6b, 6c, 6d) forming said interior partitions, said body and discs being made of a boron nitride material, said communication orifices through said partitions being holes (6p, 6q, 6r, 6s) through said discs, wherein successive holes (6p, 6q, 6r, 6s) are circumferentially offset, the cross-sectional areas of said holes being less than one-fourth of the inside cross-sectional area of said body, and wherein beam-forming director means is formed by a plurality of said peripheral holes (6s) angularly equally distributed over the periphery of the said disc (6d) most remote from said source and a terminal length (11a) of the body of said thermal decomposition duct (11) downstream from said last disc, thereby shaping a substantially uniform molecular beam of limited angular extent from said axis.

2. A generator according to claim 1 in which said heater filament (30) surrounds said thermal decomposition duct (11) without making contact therewith in order to heat it by radiation, and a heat reflector (9) surrounding said heat filament (30) in such a manner as to increase its efficiency and to make the temperature of the walls of said thermal decomposition duct (11) more uniform.

3. A generator according to claim 1, further comprising a valve (20) for controlling the flux from said source, and a metal capillary duct (2) connected downstream from said valve in order to make the flux of said primary gas more uniform, said metal capillary duct being disposed at a distance from said thermal decomposition duct (11) in order to avoid being heated, and being followed by a connection duct (5) to convey said gas to the thermal decomposition duct.

4. A generator according to claim 1, characterized by the fact that the number of said discs (6a, 6b, 6c, 6d) is at least four.

* * * * *